(12) United States Patent
Doherty et al.

(10) Patent No.: US 7,969,730 B1
(45) Date of Patent: Jun. 28, 2011

(54) PORTABLE COMPUTER WITH THERMAL CONTROL AND POWER SOURCE SHIELD

(75) Inventors: John Doherty, Austin, TX (US); Mike Collins, Austin, TX (US); Todd Steigerwald, Austin, TX (US); Phillip Bagwell, Georgetown, TX (US)

(73) Assignee: Motion Computer, Inc., Austin, TX (US)

( * ) Notice: Subject to any disclaimer, the term of this patent is extended or adjusted under 35 U.S.C. 154(b) by 0 days.

(21) Appl. No.: 12/634,340

(22) Filed: Dec. 9, 2009

Related U.S. Application Data

(62) Division of application No. 12/028,362, filed on Feb. 8, 2008, now abandoned.

(51) Int. Cl.
*H05K 7/20* (2006.01)
(52) U.S. Cl. .............. 361/679.54; 361/679.46; 361/704; 361/719; 361/816; 361/818; 174/16.3; 174/252; 174/50.52
(58) Field of Classification Search .............. 361/679.46, 361/679.54, 688, 689, 704, 714, 719, 752, 361/753, 800–802, 816, 818, 825, 799; 174/35 R, 174/35 MS, 35 GC, 50, 50.52, 50.51, 51, 174/66; 312/223.2, 223.3, 263; 29/832, 29/840, 623.2, 623.4, 623.5, 730, 841
See application file for complete search history.

(56) References Cited

U.S. PATENT DOCUMENTS

| 5,086,509 | A |   | 2/1992  | Inubushi et al.           |
|-----------|---|---|---------|---------------------------|
| 5,424,913 | A |   | 6/1995  | Swindler                  |
| 5,430,609 | A |   | 7/1995  | Kikinis                   |
| 5,583,742 | A |   | 12/1996 | Noda et al.               |
| 5,625,535 | A | * | 4/1997  | Hulsebosch et al. ... 361/719 |
| 5,656,876 | A | * | 8/1997  | Radley et al. ......... 307/150 |
| 5,752,011 | A |   | 5/1998  | Thomas et al.             |
| 5,835,298 | A |   | 11/1998 | Edgerton et al.           |
| 5,907,471 | A | * | 5/1999  | Patel et al. ........... 361/500 |
| 5,931,297 | A |   | 8/1999  | Weill et al.              |
| 5,969,940 | A |   | 10/1999 | Sano et al.               |

(Continued)

FOREIGN PATENT DOCUMENTS

JP  11-143585  5/1995

OTHER PUBLICATIONS

Office Action mailed Jun. 16, 2009 for U.S. Appl. No. 12/028,632.

(Continued)

*Primary Examiner* — Michael V Datskovskiy
(74) *Attorney, Agent, or Firm* — Charles D. Huston; Daffer McDaniel, LLP

(57) ABSTRACT

A portable computer having a partially sealed cooling system is disclosed. The portable computer contains heat transfer materials that function to remove heat from a sealed area of the portable computer to an unsealed area where the heat may be more effectively dissipated. A portable computer having a power source shield is also disclosed. The shield may be formed to partially surround a portion of the power source, and may be formed by partially enclosing a power source in a conductive material; forming an opening in the conductive material on one side of the power source; installing the power source near an edge of the electronic device; and orienting the power source so that the opening faces the edge of the electronic device.

13 Claims, 9 Drawing Sheets

U.S. PATENT DOCUMENTS

| | | | |
|---|---|---|---|
| 5,974,557 A | | 10/1999 | Thomas et al. |
| 6,119,179 A | | 9/2000 | Whitridge et al. |
| 6,122,167 A | * | 9/2000 | Smith et al. ............... 361/679.47 |
| 6,138,826 A | | 10/2000 | Kanamori et al. |
| 6,145,280 A | * | 11/2000 | Daroux et al. .................. 53/433 |
| 6,216,235 B1 | | 4/2001 | Thomas et al. |
| 6,233,464 B1 | | 5/2001 | Chmaytelli |
| 6,262,886 B1 | | 7/2001 | DiFonzo et al. |
| 6,267,790 B1 | * | 7/2001 | Daroux et al. ............... 29/623.2 |
| 6,319,199 B1 | | 11/2001 | Sheehan et al. |
| 6,336,080 B1 | | 1/2002 | Atkinson |
| 6,487,668 B2 | | 11/2002 | Thomas et al. |
| 6,567,120 B1 | | 5/2003 | Hamamura et al. |
| 6,657,859 B1 | | 12/2003 | Karr |
| 6,659,274 B2 | | 12/2003 | Enners |
| 6,684,089 B1 | | 1/2004 | Lee |
| 6,746,638 B1 | | 6/2004 | Zadesky et al. |
| 6,789,611 B1 | | 9/2004 | Li |
| 6,803,144 B2 | * | 10/2004 | Hovi et al. .................... 429/123 |
| 6,809,698 B2 | | 10/2004 | Tsai et al. |
| 6,888,332 B2 | | 5/2005 | Matsushita |
| 6,927,978 B2 | | 8/2005 | Arai et al. |
| 7,013,558 B2 | * | 3/2006 | Bachman ........................ 29/832 |
| 7,016,181 B2 | | 3/2006 | Ito et al. |
| 7,145,769 B2 | | 12/2006 | Chen |
| 7,155,202 B2 | | 12/2006 | Helal |
| 7,184,260 B2 | | 2/2007 | Itoh et al. |
| 7,209,035 B2 | | 4/2007 | Tabankin et al. |
| 7,221,957 B2 | | 5/2007 | Takamura et al. |
| 7,245,482 B2 | | 7/2007 | Kim |
| 7,273,089 B2 | | 9/2007 | Hata et al. |
| 7,278,579 B2 | | 10/2007 | Loffredo et al. |
| 7,286,894 B1 | | 10/2007 | Grant et al. |
| 7,312,992 B2 | | 12/2007 | Jory et al. |
| 7,325,846 B2 | | 2/2008 | Smith et al. |
| 7,336,489 B1 | | 2/2008 | Chen et al. |
| 7,382,607 B2 | | 6/2008 | Skillman |
| 7,388,161 B2 | * | 6/2008 | Hsieh et al. ................... 174/382 |
| 7,405,930 B2 | | 7/2008 | Hongo et al. |
| 7,428,143 B1 | | 9/2008 | Jones et al. |
| 7,446,753 B2 | | 11/2008 | Fitch et al. |
| 7,456,751 B2 | | 11/2008 | Arai et al. |
| 7,495,895 B2 | | 2/2009 | Carnevali |
| 7,514,765 B2 | * | 4/2009 | Huang et al. .................. 257/659 |
| 7,674,540 B2 | * | 3/2010 | Adams et al. .................... 429/19 |
| 2002/0053421 A1 | | 5/2002 | Hisano et al. |
| 2002/0067520 A1 | | 6/2002 | Brown et al. |
| 2002/0085342 A1 | | 7/2002 | Chen et al. |
| 2003/0184958 A1 | | 10/2003 | Kao |
| 2003/0236102 A1 | | 12/2003 | Kawai et al. |
| 2004/0107372 A1 | | 6/2004 | Morisawa |
| 2004/0201602 A1 | | 10/2004 | Mody et al. |
| 2004/0204041 A1 | | 10/2004 | Fillebrown et al. |
| 2005/0040224 A1 | | 2/2005 | Brinton et al. |
| 2005/0128693 A1 | | 6/2005 | Itoh |
| 2005/0130721 A1 | | 6/2005 | Gartrell |
| 2005/0139498 A1 | | 6/2005 | Goros |
| 2005/0276018 A1 | | 12/2005 | Moore et al. |
| 2005/0280984 A1 | | 12/2005 | Huana et al. |
| 2006/0044288 A1 | | 3/2006 | Nakamura et al. |
| 2006/0057458 A1 | * | 3/2006 | O'Dea et al. .................. 429/164 |
| 2007/0085015 A1 | | 4/2007 | Castleberry |
| 2007/0139873 A1 | | 6/2007 | Thomas et al. |
| 2007/0174152 A1 | | 7/2007 | Bjornberg et al. |
| 2007/0188306 A1 | | 8/2007 | Tethrake et al. |
| 2007/0282208 A1 | | 12/2007 | Jacobs et al. |
| 2008/0019093 A1 | | 1/2008 | Hongo |
| 2008/0081679 A1 | | 4/2008 | Kawasaki et al. |
| 2008/0094786 A1 | | 4/2008 | Liou et al. |
| 2008/0123287 A1 | | 5/2008 | Rossell et al. |
| 2008/0227507 A1 | | 9/2008 | Joo |
| 2009/0200378 A1 | | 8/2009 | Doherty et al. |
| 2009/0201636 A1 | | 8/2009 | Doherty et al. |
| 2010/0008028 A1 | | 1/2010 | Richardson et al. |

OTHER PUBLICATIONS

Final Office Action mailed Sep. 4, 2009 for U.S. Appl. No. 12/028,632.

International Search Report & Written Opinion, PCT/US2009/032845, mailed Sep. 18, 2009.

Office Action mailed Feb. 3, 2010 for U.S. Appl. No. 12/028,458.

* cited by examiner

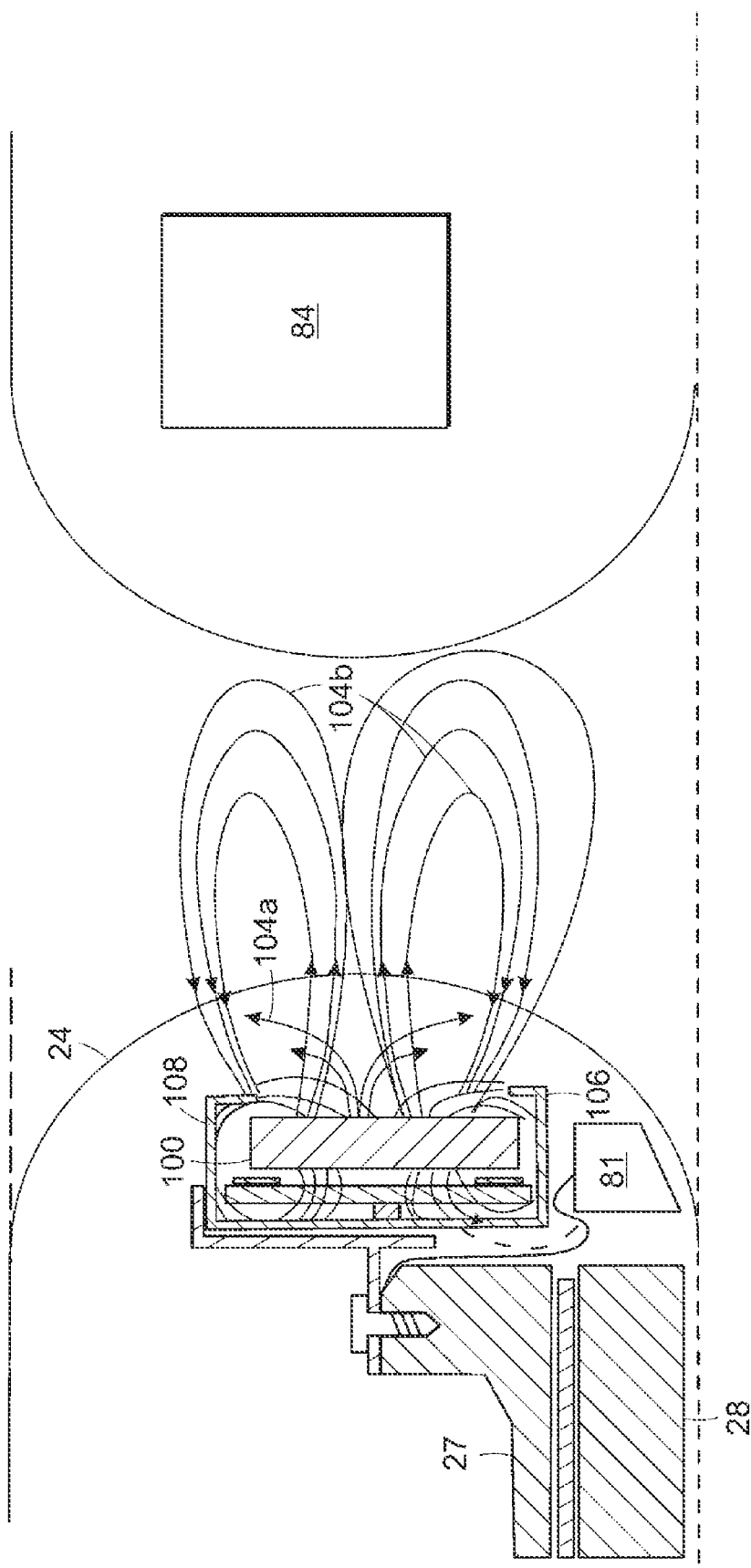

PORTABLE COMPUTER WITH THERMAL CONTROL AND POWER SOURCE SHIELD

PRIORITY CLAIM

The present application is a divisional from prior U.S. application Ser. No. 12/028,362 filed Feb. 8, 2008.

BACKGROUND OF THE INVENTION

1. Field of the Invention

The invention relates to the field of electronic devices, and more particularly, to a cooling and shielding system for a portable computing device that can be used to gather data in a number of environments, such as healthcare, warehouse, and shipping environments. The cooling and shielding system can be used to isolate sensitive components from electromagnetic interference while also effectively cooling the computer without providing an entry point for contaminants to enter the system.

2. Description of the Related Art

Portable computers (PCs), including tablet PCs, laptop computers, and personal digital assistants (PDAs), allow computer users to utilize many of the functions of a personal computer while facilitating freedom of movement about a workplace. Particularly, tablet PCs can offer a very high level of mobility and flexibility to the user. Tablet PCs are well suited for use in the medical profession, where a doctor or nurse can use the tablet PC in place of a pen and paper. Because tablet PCs allow users to easily update files electronically while also recording data on a single device and moving from point to point, they are potentially very useful in manufacturing and shipping environments where they may be used to track inventory, record inspection data and manage work flow.

By comparison to a desktop computer, portable computers are compact, lightweight, and easy to carry. However, portable computer designs may be limited by the tradeoff between compactness and robustness. In other words, PCs can be made small and lightweight by reducing the amount of material that is devoted to strengthening and cushioning the device. Similarly, adding design elements that strengthen a device or make it more impact resistant usually entails making the device heavier and/or larger. Another design consideration, processing capability, may also inhibit the utility of portable computers in particularly moist or dirty environments. For instance, increasing the processing power of a computer generally equates to increasing the amount of heat the device will produce. Such heat must be dissipated, either through an active cooling system or through the body of the device. Excessive heat dissipation through the body of the device may cause the exterior of the device to become so hot that it may burn a user or at least cause them discomfort. While an active cooling system, such as a fan, cools the computer in a more ergonomic fashion, an active cooling system generally requires recesses and an airflow path through the computer. The airflow openings of a typical active cooling system may make the portable computer susceptible to contamination by dust, dirt, and germs. Similarly, because the contamination may occur in sensitive areas of the PC that are difficult and impractical to access and clean, it may be difficult to disinfect or clean the PC without damaging it.

SUMMARY OF THE INVENTION

The problems outlined above are in large part solved by a portable computer that comprises both a sealed area and an unsealed area. The sealed area may contain a heat pipe. The unsealed area may have a boundary that is mating and adjacent to the sealed area, and may contain a fan and a radiator. The heat pipe may sealingly extend across the boundary between the sealed and unsealed areas and thermally couple with the radiator.

In another embodiment, a portable computer is disclosed that comprises a power source and an electrically conductive foil. The electrically conductive foil may be configured to at least partially surround at least a portion of the power source, and may comprise an opening on one side of the power source for the purposes of allowing electromagnetic radiation to emanate from the power source in a controlled fashion.

A method for fabricating an electromagnetic shield in an electronic device is also disclosed. The method comprises enclosing at least a portion of a power source in a conductive material; forming an opening in the conductive material on one side of the power source; installing the power source near an edge of the electronic device; and orienting the power source so that the opening faces the edge of the electronic device.

BRIEF DESCRIPTION OF THE DRAWINGS

Other objects and advantages of the invention will become apparent upon reading the following detailed description and upon reference to the accompanying drawings in which:

FIG. 7b is a left side perspective view showing a shielded power source assembly mounted in a portable computer.

Figure 1B:
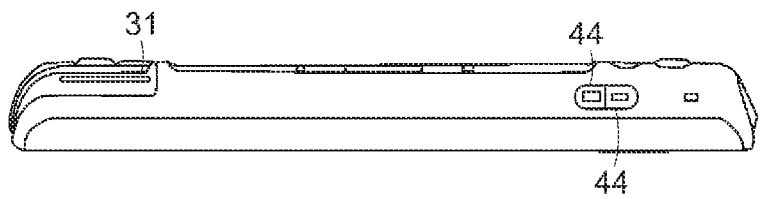
FIG. 1b is a top perspective view of the portable computer of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but are instead intended to cover all modifications, equivalents and alternatives falling within the spirit and scope of the present invention as defined by the appended claims.

DETAILED DESCRIPTION OF PREFERRED EMBODIMENTS

In response to the aforementioned limitations of portable computers, a tablet style portable computer is disclosed that is optimized to function in typically adverse environments, such as healthcare, manufacturing, and shipping environments. These environments are unique because they subject the computer to a disproportionately high amount of contaminants by comparison to a typical office environment. Healthcare environments may expose the computer to hazardous airborne contaminants, such as germs and bacteria. Similarly, manufacturing and shipping environments may expose a computer to liquids, dust and other particulate contaminants that can penetrate into a computer and degrade performance or cause the computer to malfunction. Because of the increased possibility of contamination and accumulation of dust, computers used in these fields must be designed to prevent contamination of interior surfaces while incorporating an exterior design that is easy to clean. These fields also require workers to be very mobile, so any computer focused for such use should be resistant to impact as well as easily carried and maneuvered by the user.

Figure 1A:
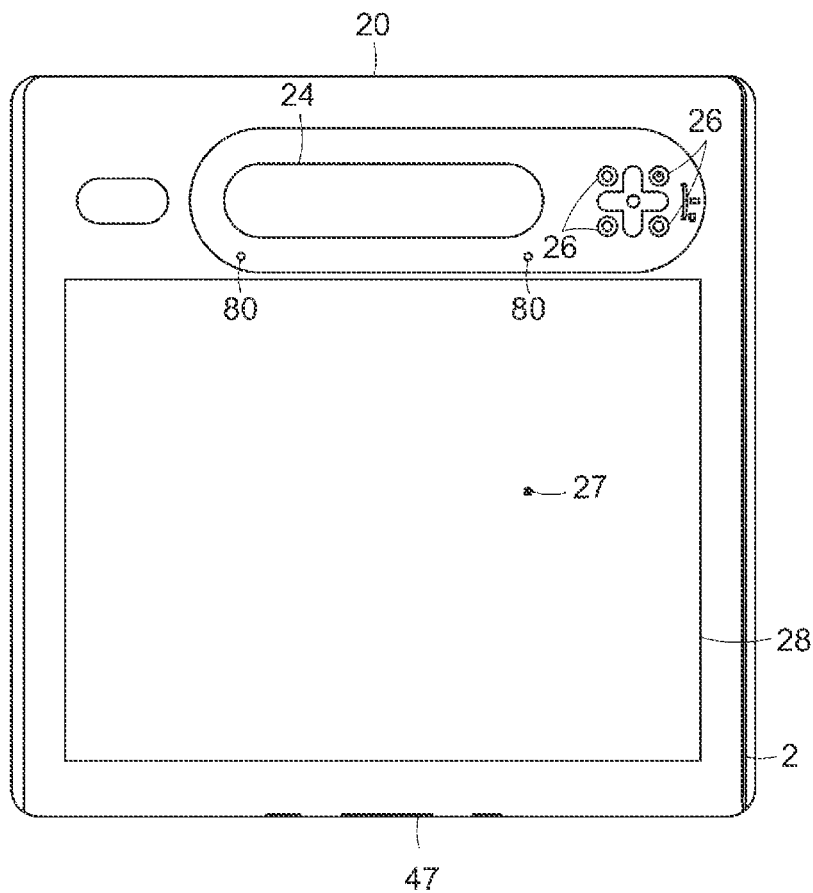
FIG. 1a is a front perspective view of a portable computer that is optimized for use in a clinical environment.

Turning to the drawings, FIG. 1a is a front view showing a portable computer (PC) 20, such as a tablet computer, that is optimized for use in the healthcare industry. The body of the portable computer incorporates a handle 24, and has an overmolded elastomer exterior 22. The elastomer exterior 22 serves several important functions. The soft exterior 22 gives the PC user a better tactile feel by virtue of its softness, and the material may help to absorb impact and prevent damage if the portable computer is dropped or otherwise subject to impact. Further, soft exterior 22 has a low thermal conductivity that will insulate a user from heat produced by the PC, and can be molded to conform to the contours of the computer. An additional benefit of using a particular plastic material, such as Valox or a similar low durometer polymer, is that it is resistant to solvents that may be used to clean and disinfect the computer. Here, Valox is a family of semi-crystalline thermoplastic polyester resins that are based on polybutylene terephthalate (PBT) and/or polyethylene terephthalate (PET) polymers. FIG. 1a also shows a 10.4 inch liquid crystal display (LCD) 28 that allows information to be viewed easily without the need for excessive scrolling, and a first set of thumb controls 26. The first set of thumb controls 26 may be used to operate a variety of devices that may be integrated into the PC, such as a digital camera and fingerprint scanner.

Many of the features of PC 20 are geared for use in a clinical environment. However, it will be apparent to one of skill in the art that these features will render the device useful in a number of environments. In particular, handle 24 makes the computer easy to grip, a robust design helps to protect the computer from impact, and a stylus input device enables workers to use the device without a keyboard or mouse. The device may also include various integrated data capture devices, such as a fingerprint scanner, bar code scanner, and radio frequency identification (RFID) tag reader to authenticate the identity of users, patients and medication. Other integrated devices, such as a camera for documenting symptoms and injuries may also prove useful. The computer may include 802.11a/b/g (Wi-Fi), wireless broadband (WWAN), and Bluetooth radios that allow it to wirelessly interface with other devices and networks. This heightened level of connectivity may help a user gather data without taking notes or subsequently transcribing recorded data, and may also allow data to be instantaneously uploaded to a network to update files stored in a central location. PC 20 may also help to save time by equipping workers with a small dedicated computer so that they will not have to find and share a common desktop workstation when they need to use a computer.

Figure 1C:
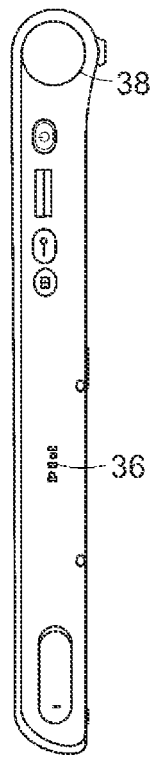
FIG. 1c is a right side perspective view of the portable computer of FIG. 1.
Figure 2:
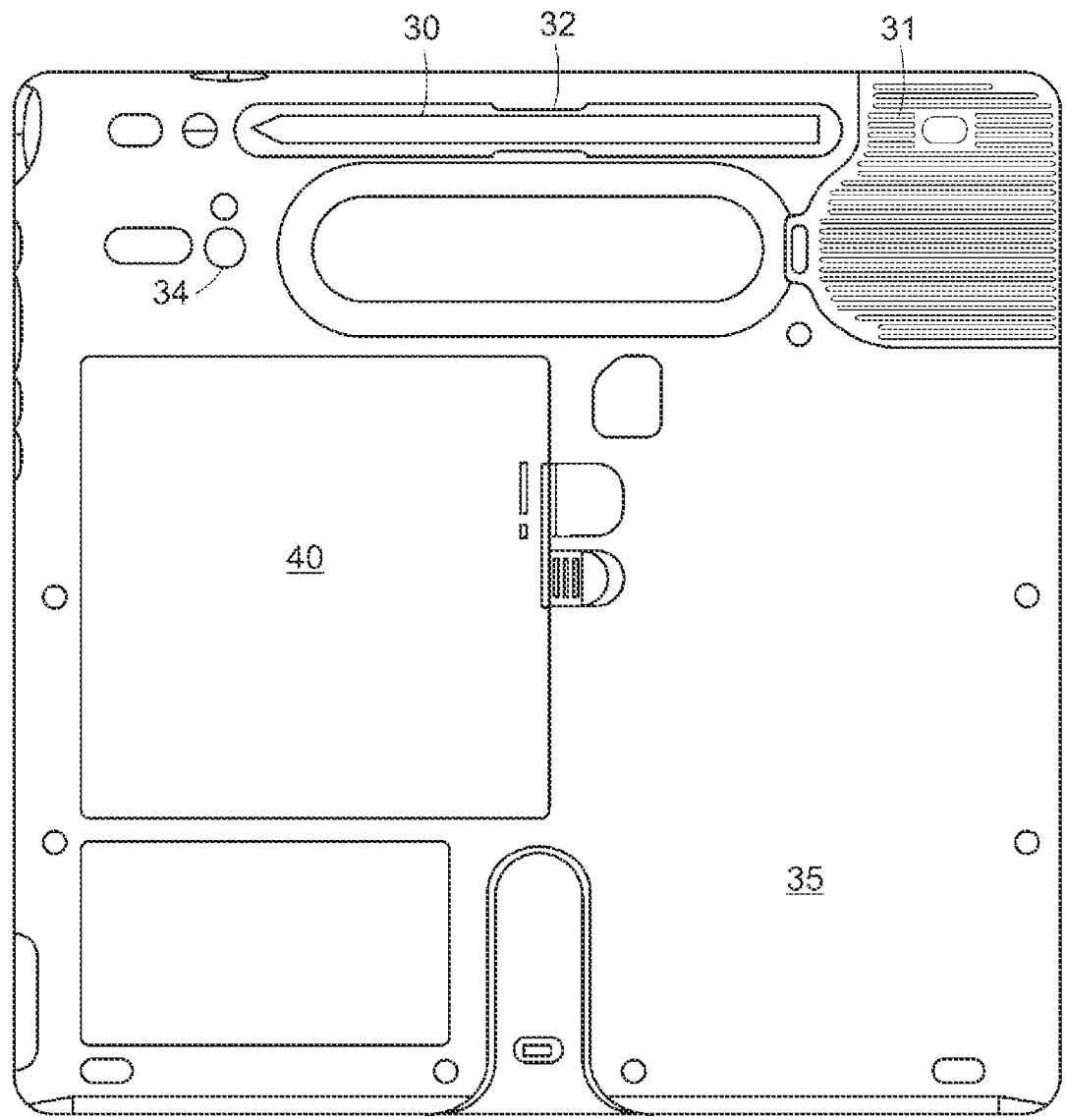
FIG. 2 is a rear perspective view of the portable computer of FIG. 1.

FIG. 1b is a top view of PC 20 (FIG. 1a) illustrating a second set of thumb controls 44 and fan cover 31. FIG. 1c is a right-hand view of PC 20 illustrating bar code scanner 38 and RFID reader 36. FIG. 2 is a rear view of PC 20. The back of the device is covered by soft elastomer overmolding 22. The soft elastomer overmolding may be achieved by first molding a plastic cover to mate with the metal frame of the computer, inserting the plastic cover into an elastomer mold to form an elastomeric layer on the plastic, and subsequently installing the plastic cover onto the metal frame of the computer. However, it is noted that similar processes for achieving the soft elastomer outer layer, or overmolding, may be substituted. Returning to FIG. 2, recess 32 may be formed within handle 24 of PC 20 to store stylus 30. Camera lens 34 is also located on the back of PC 20, allowing the PC to be used as a digital camera by using the LCD as a viewfinder. The camera feature enables a user to easily operate PC 20 to create photographic documentation, such as a picture of a wound or similar documentation. FIG. 2 also shows battery 40 and rear cover 35 of PC 20.

Figure 3:
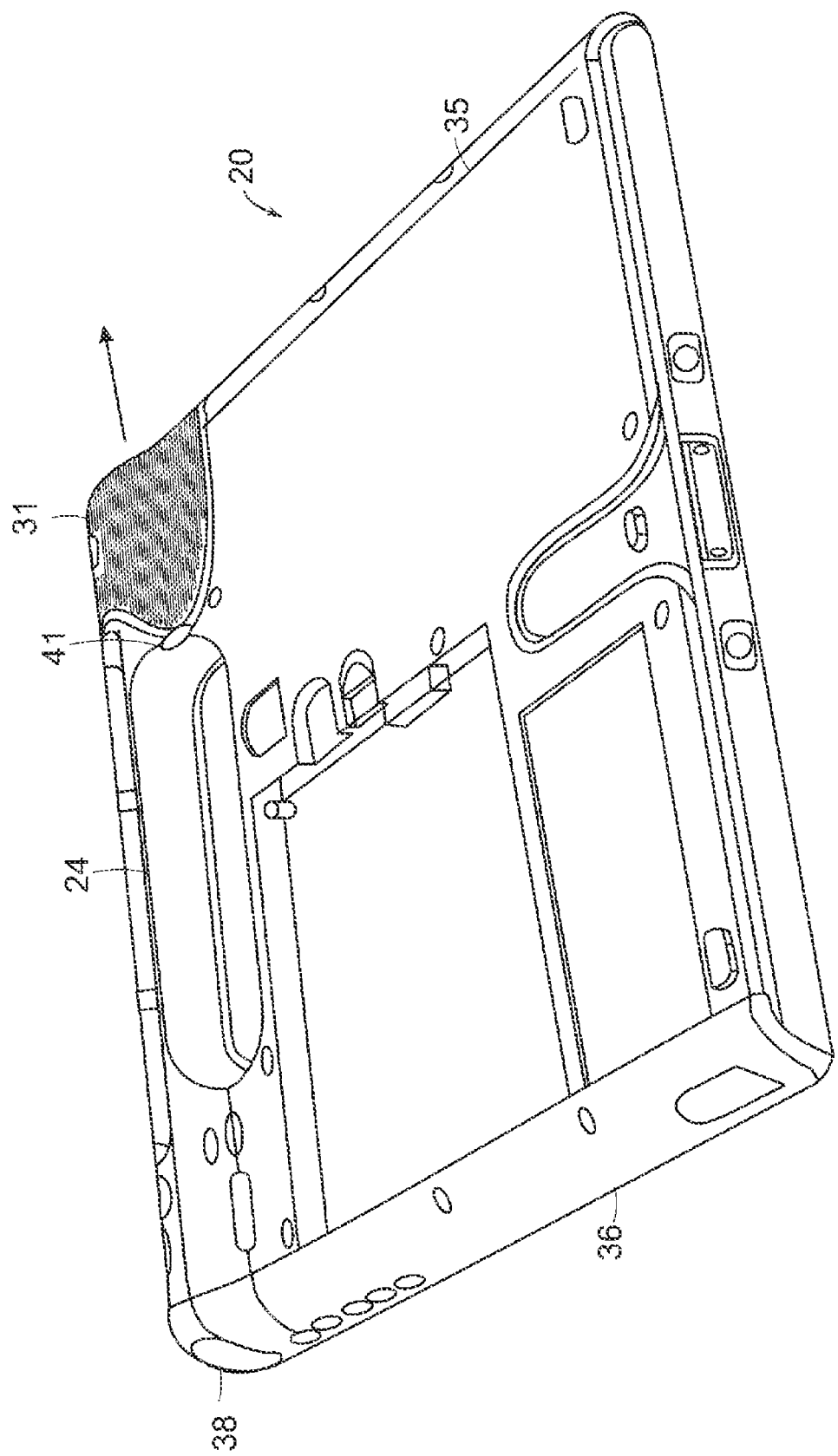
FIG. 3 is a plan view showing the back of the portable computer of FIG. 1.

FIG. 3 is a plan view showing the rear surface of PC 20 from an isometric viewing angle, displays the locations of RFID reader 36 and bar code scanner 38. Here, rear cover 35 functions to seal the majority of the computer's components. Unsealed cover 31 may cover elements of active cooling system that protrude from the sealed cover, such as a fan and heat radiator, discussed in more detail below. Since these elements of PC 20 are exposed to air flow from the ambient environment, they are subject to contamination and, therefore, may be easily accessed for cleaning. As such, unsealed cover 31 may be released with latch 41 and slide away from rear cover 35 of PC 20 so that the exposed elements of the active cooling system may be accessed for cleaning and disinfecting.

The computer's unique set of integrated input devices can be used to assist a clinical worker to create documentation, administer medication, and manage work flow. The worker can also use the computer to access and update patient data and scheduling at any time. This may have the effect of eliminating wasteful double documentation, increasing the accuracy of reported information, and decreasing the potential for errors in transcription of information and medication administration. In short, the computer may greatly improve a healthcare worker's ability to correctly administer medication and treatment to patients.

In order to prevent contamination, it is important for the computer to be relatively well sealed. As such, any seams, joints, or openings of the computer may be sealed so that the computer will conform to IP Code 54, as defined in International Standard IEC 60529 which is herein incorporated by reference, as well as less stringent IP Code 53. To conform to IP Code 54, a device must resist water ingress when exposed to splashing water and also resist particulate infiltration when exposed to the conditions of a dusty environment. In other words, the device may be substantially impermeable to penetration by dust and liquids. This sealing is may be accomplished by including a compressible seal, such as an O-ring or similar sealing mechanism between any joints or seams in the body of the device. The body of the computer may comprise multiple parts that are fastened together with a compressible gasket between them to resist the ingress of liquids, moisture, and even contaminated air. The housing of the battery may be similarly designed to include a seal so that only the external surface of the computer and battery may need to be wiped clean to effectively sanitize the computer. Further, the thumb controls of the computer are snap dome sensors, capacitive touch sensors, or a similar sensor that does not require an opening in the surface of the computer. As such, even the controls of the computer may comprise a smooth surface that is easy to clean and resistant to contamination from dirt, germs, and/or biological fluids.

In addition to the various integrated devices outlined above, including the RFID reader, bar code scanner, and digital camera, the tablet computer may also have an abundant set of input and output devices. Of note, the computer may transmit and receive sound data via a wireless communications controller in conjunction with an audio subsystem that includes a speaker system. The PC may also have wireless communications capability to transmit gathered patient information to a central network location so that patient files can be updated instantaneously. In the healthcare environment, this means that up to the minute information consisting of pictures, vital sign measurements, and other patient data may be readily available. In other working environments, many of the same tools may be used to track work flow, delivery, and manufacturing statistics.

The computer may include a digitizer positioned behind the display screen to permit data entry from a pen type stylus. For example, the computer may include a high resolution 10.4 inch digitizer mounted underneath the LCD, such as an RF inductive digitizer, that is configured to work with Microsoft Windows Vista® or a similar operating system. The digitizer may allow notes to be instantly transcribed using text recognition software, eliminating the need for subsequent manual transcription. The computer may also be equipped to work with Bluetooth devices or devices that use similar wireless communications protocols, including Wi-Fi and WWAN networks. Accordingly, the device may be used to receive input from wireless enabled data acquisition devices, such as stethoscopes, blood pressure monitors, thermometers, and similar devices to acquire data. This input may be instantly analyzed by a user or transmitted to a network so that it may be saved and accessed from a central location.

To store data, the computer may contain at least one hard disk drive (HDD), as specified by a design engineer. In some embodiments, the computer may employ a solid state memory or solid state drive (SSD) instead of or in addition to an HDD. Using a SSD that contains no moving parts may help the computer to withstand impact because moving parts are more likely to sustain damage as a result of impact. In order to protect a HDD with moving parts, the computer may employ a shock detection system. The shock detection system may detect shocks, extreme vibrations, and falls. When a shock, extreme vibration, or a fall is detected, the shock detection system may park the HDD heads away from the disk, which can prevent HDD failures and data loss. The shock detection system may be achieved by considering input from an accelerometer that is coupled to the device. An accelerometer may be a micro-electromechanical (MEMS) device, or MEMS accelerometer, that contains at least one accelerometer or inclinometer. The accelerometer may monitor changes in acceleration along three major axes so that it may detect almost any motion sustained by a device. Accelerometers vary in the sensitivity of their target applications in that they are able to measure magnitudes of acceleration on a scale of 0-1.5 g for higher resolution applications and 0-6 g (or more) in lower resolution applications. Here, a higher resolution accelerometer, such as a 1.5 g accelerometer may be used.

An exemplary accelerometer may contain a packaged sensor element and is designed to have a customizable sensitivity level in terms of the amount of motion or change in position that is required to cause the device to generate an interrupt signal. The interrupt signal may be generated for a change in acceleration on any axis above a predetermined threshold value when the device is programmed to detect motion, and may be generated for a change in acceleration on all three axes below a threshold value with the device is programmed to detect a freefall. Generally, the sensor element may function on the principle of differential capacitance by including a displaceable silicon structure that is displaced when the sensor is subject to acceleration. The displacement of the silicon structure may generate a change in capacitance when it undergoes acceleration, and the change in capacitance can be used to generate an output voltage that corresponds to the experienced acceleration. By taking measurements as often as one hundred times per second, an accelerometer can detect even the slightest angular or linear movements. In practice, accelerometers have been observed to detect a free-fall before a device has fallen three inches. As such, the accelerometer may help to protect the HDD from damage during a fall by immediately detecting a freefall and generating an interrupt signal that parks the heads of the HDD so that it will be less likely to sustain damage.

The computer may also include an audio subsystem, which would allow for sound input and output so that workers can record and play back statements or verbal annotations. As such, the computer may also contain a sealed speaker, microphone array, and amplifier. However, since the sealed nature of the computer makes it resistant to contamination from dirt, germs, and other contaminants, any wired audio connections should be made via a docking station.

As noted above, the computer also integrates two sets of thumb controls. The thumb controls may comprise a variety of sensors and indicators. Each sensor may be assigned a unique identifier by a controller, such as a keyboard controller. The controller may use the identifier to communicate user input to the processor. Particular sensors, or thumb controls, may be associated with particular features of the computer, such as the operation of the camera, RFID reader, or bar code scanner. Both the first and second set of thumb controls may be accomplished with resistive or capacitive touch sensors. Each type of sensor should be sealed so that it will not comprise an opening in the device. Accordingly, the sensor selection will allow even the thumb control portions of the device to be wiped clean and easily decontaminated and/or disinfected.

Figure 4:
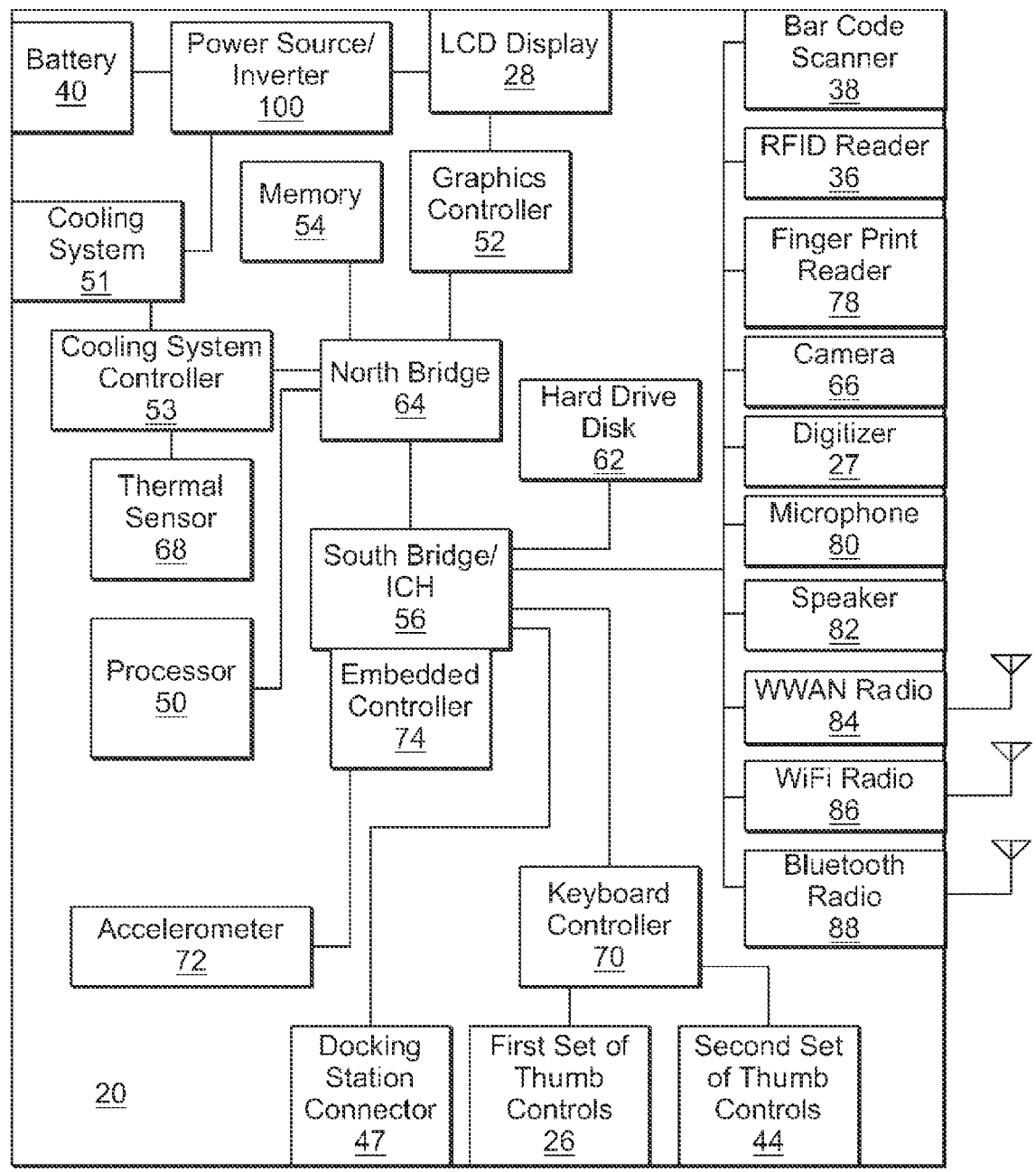
FIG. 4 is a block diagram of at least a portion of a representative architecture for a portable computer that is optimized for use in a clinical environment.

FIG. 4 is a block diagram showing a representative architecture of a portion of PC 20 that is optimized to function in a clinical environment. PC 20 contains processor 50 that is connected to north bridge 64 and input/output controller hub (ICH) 56 or a south bridge. Here, the north bridge may connect memory 54, HDD 62, and graphics controller 52 to operate the LCD 28. To power LCD 28, a power source or inverter 100 is included and connected to battery 40. Power source 100 may be a significant source of heat, and as such may be thermally coupled to cooling system 51. Cooling system 51 may be controlled by cooling system controller 53, which may receive input from one or more thermal sensors 68. ICH 56 may connect a multitude of input/output devices to PC 20, which are discussed in more detail below. To detect impact and potential freefalls, accelerometer 72 may connect to the computer via embedded controller 74. ICH 56 may extend USB, Ethernet, or similar input/output (I/O) connectors to docking station connector 47. Also via ICH 56, keyboard controller 70 may receive user input via first and second sets of thumb controls 26 and 44, respectively. To gather data, ICH 56 may connect bar code scanner 38, RFID reader 36, camera 66, finger print scanner 78, digitizer 27, and microphone array 80. To output sound to a user, PC 20 have also have speaker(s) 82 that are connected through the ICH. PC 20 may also house a variety of radios that are also connected via ICH 56. A WWAN transceiver and antenna 84 may connect PC 20 to a wireless broadband network; a WiFi transceiver and antenna 86 may connect PC 20 to a wireless local area network; and a Bluetooth transceiver and antenna 88 may enable the computer to communicate with Bluetooth enabled devices. Because the PC may contain multiple radios, it may be necessary to selectively activate and deactivate particular radios, such as the WWAN and WiFi radios so that they do not transmit simultaneously. Accordingly, in the remaining radios may be selectively activated or deactivated based on user input and automated processes, such as power management settings.

An unwanted side effect of sealing the computer, as noted above is that the computer may be difficult to cool because a completely sealed cooling system can only cool through passive means. In other words, sealing the computer forecloses the option of cooling it by circulating cooler air from the ambient environment through the computer. When more heat is generated than can be passively cooled, the computer may either expose a user to an excessively hot surface or limit heat generation by limiting processing power. Limiting processing power, or throttling the processor, may render the computer less effective, but may be necessary to prevent the computer from sustaining damage caused by excessive heating.

As performance and processing power of the computer are improved, for example, by incorporating faster processors, the computer may generate heat at even higher rates. Since the passive cooling system may offset the benefit of a faster processor, the limitations associated with passively cooling the computer may become a significant hindrance. Still, it is noted that in some circumstances, scaling back the performance of the processor to limit heat generation may be a viable mode of cooling. To this end, many processors are equipped with built-in thermal sensors. These sensors and other thermal sensors installed in the computer may be used to monitor thermal conditions at key points inside the computer. In a passively cooled system, these sensors may be useful to generate interrupt signals at particular temperatures to initiate processor limitations, automatic saving of sensitive system data, and even an emergency shut-down when a critical temperature is reached. Additionally, particular subsystems such as the backlight of the LCD may be powered down to conserve battery power and limit heat generation.

To maximize passive cooling capacity, the computer may have a chassis and one or more exterior plates that are designed to conduct heat away from the computer and dissipate it into the surrounding environment. These conductive elements may be thermally coupled to the portions of the computer that generate the most heat, such as the processor and power supply, by using thermal greases, heat pipes, heat spreading materials such as GraphTech's Spreadershield, an axis specific graphite based heat spreading material, and similar conductive materials. To maximize the ability of the computer to dissipate heat, the frame and body of the computer may be made from a thermally conductive material, such as a magnesium-alloy. While this type of construction may allow portions of the computer to become quite hot, a user can be insulated from excessive heat by the elastomer overmolding (or similar insulating layer).

While it may be desirable to maximize the extent to which passive cooling is used, it is unlikely that a passive cooling system will adequately cool the PC if it operates at a reasonable processing capacity for an extended period of time. As such, the portable computer may include a partially sealed active cooling system that incorporates a radiator and fan assembly in a portion of the device that is outside of the sealed cover of the PC. In other words, while substantially all of the computer may be sealed, thermally conductive elements, such as heat pipes, may be used to conduct heat to an unsealed location where it can be actively dissipated.

Figure 5:
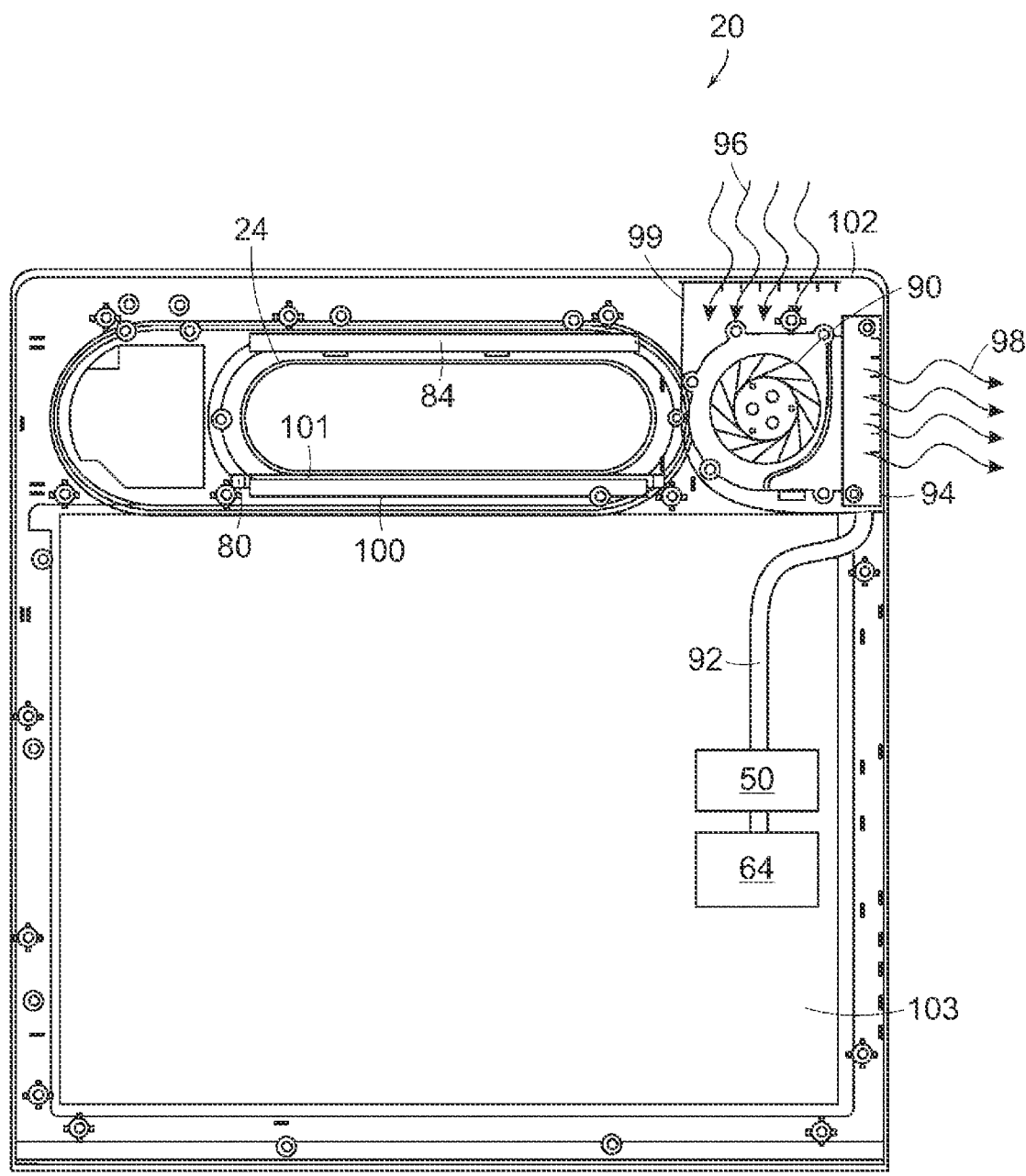
FIG. 5 is a rear perspective view of a portable computer that is optimized for use in a clinical environment with the rear cover removed to show at least a portion of internal components of the portable computer.

FIG. 5 shows a rear view of PC 20 with the rear covers removed. Here, the locations of active cooling components can be seen, along with the other components located near handle 24. Below handle 24, PC 20 houses microphones 80 that are connected via microphone cable 101, along with electrical power source 100 that supplies power to the backlight of the LCD. In this embodiment, the power source is a power inverter that converts power received from the DC power source of the device to AC power to power the backlight of the LCD. Above handle 24, the computer houses WWAN antenna 84. To the right of handle 24, the computer houses components of the partially sealed active cooling system. While the bulk of the components of PC 20 are sealed within sealed area 103 of PC 20, an active cooling system may be necessary to adequately cool PC 20. Here, heat pipe 92 may protrude across boundary 99 between sealed area 103 and unsealed area 102 that houses fan 90 and radiator 94 to draw heat to the radiator from heat producing parts of PC 20, such as the processor and power supply. Because the heat pipe must follow a complex path that cannot be accomplished with flat heat pipe material, heat pipe 92 may be formed from round heat pipe material and flattened on the ends to increase thermal conductivity and contact area at locations where heat pipe 92 absorbs or dissipates heat. Unsealed area 102 may be created by forming a recess in the rear cover of the portable computer so that the rear cover will seal the internal components of the computer while also serving as boundary 99, or sealed interface between the sealed and unsealed areas of the computer. The unsealed recessed area may house the active cooling system and may be covered by an unsealed cover as show in FIGS. 2 and 3. In unsealed area 102 of PC 20, heat pipe 92 may thermally couple to radiator 94. Here, fan 90 may circulate cool air 96 from the ambient environment across radiator 94 so that heat from the radiator may be dissipated into the air that is then discharged as warm air 98. While this portion of PC 20 is open to the ambient environment, it should still be configured so that it can be sprayed with a disinfectant or cleaning material and wiped clean to the extent possible. Accordingly, it is desirable to select a fan that is easily replaceable and tolerant to moisture.

Figure 6A:
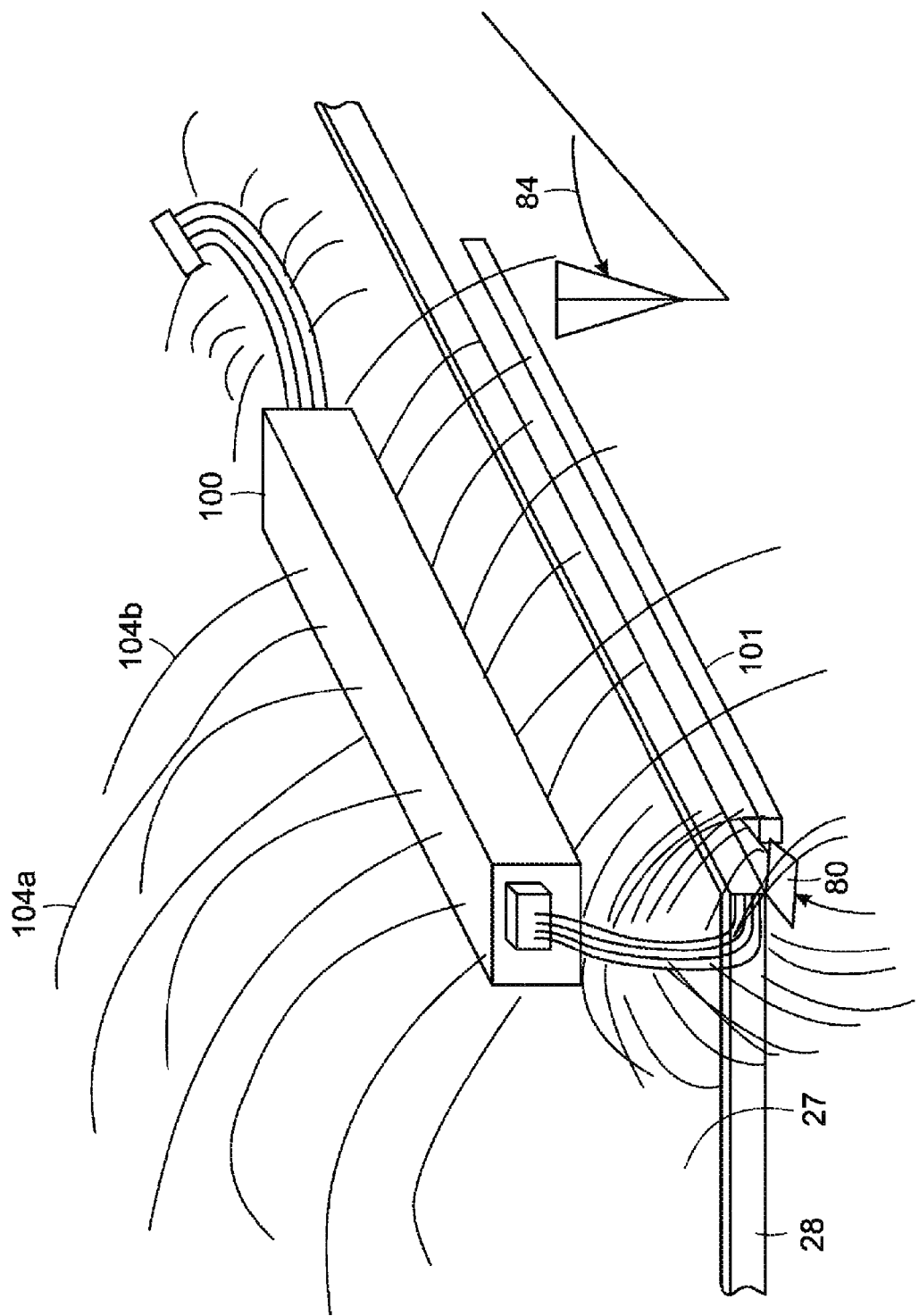
FIG. 6a is a plan view showing an unshielded power source assembly mounted in a portable computer.
Figure 6B:
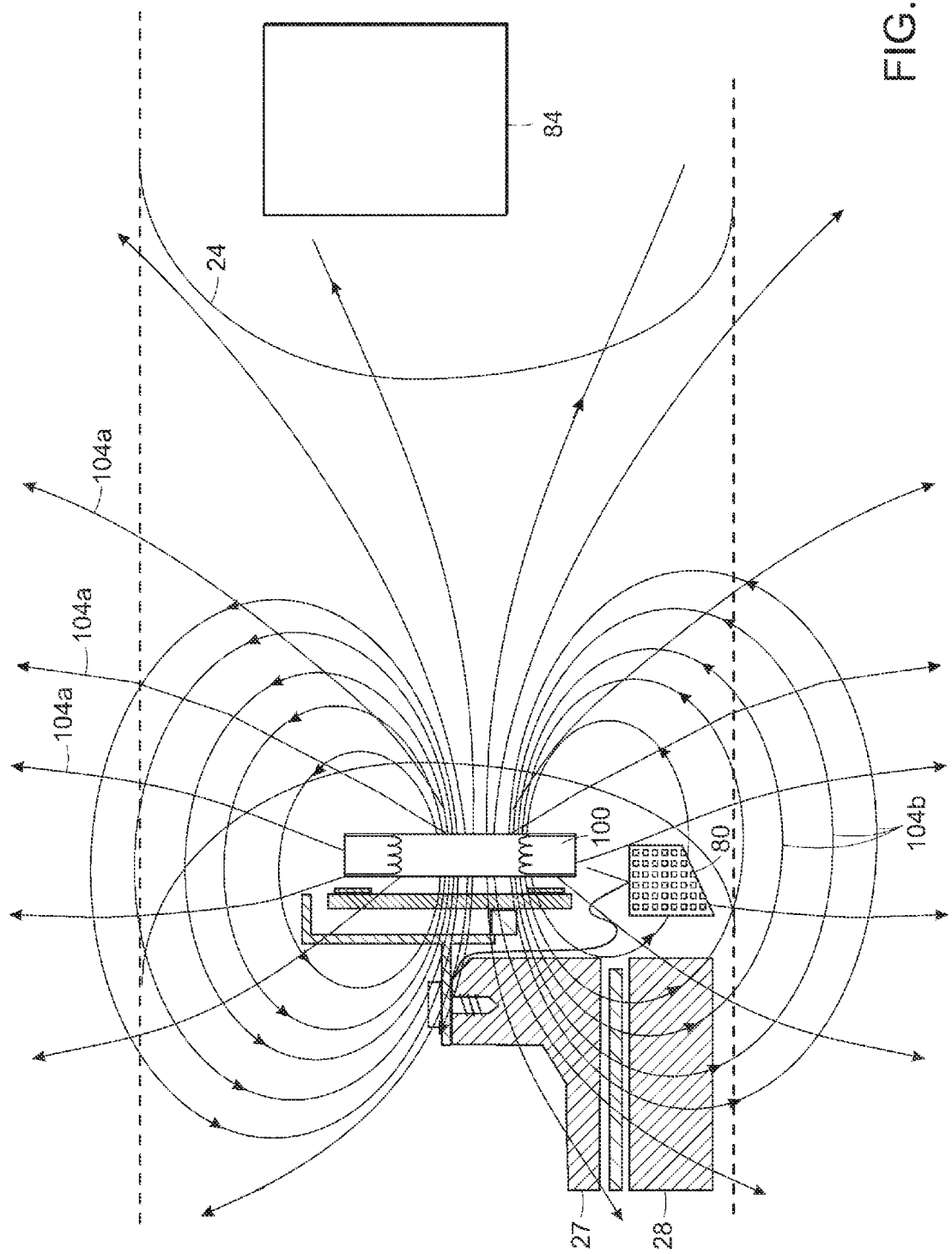
FIG. 6b is a left side perspective view showing an unshielded power source assembly mounted in a portable computer.

FIG. 6a shows another component of the portable computer that may generate a significant amount of heat: a power source that may be included to power the lighting system, or backlight, of the LCD. FIG. 6a is a plan view showing the power source with nearby components, and FIG. 6b is a left side view showing the same components. In early prototypes of the portable computer, the power source was observed to produce a substantial electromagnetic field (EMF) in addition to heat. Generally, the EMF of an unshielded power source comprises E-field radiation 104a and H-field radiation 104b, where E-field radiation 104a is the electrically intense component of the EMF and H-field radiation 104b is the magnetically intense component of the EMF. The vectors representing the EMF differ slightly in that E-field radiation 104a emanates radially from power source 100, while H-field radiation 104b is represented as looping back to its source. Notably, the EMF generated by power source 100 was observed to interfere with the functionality of digitizer 27 and other parts of the computer. This interference was particularly detrimental to the digitizer's ability to sense the presence and movements of the stylus near LCD 28 surface of the computer. This problem is illustrated in FIGS. 6a and 6b, which show power source 100 and associated EMF flux 104a and 104b. In addition to interfering with digitizer 27 mounted behind LCD 28, the EMF was noted to interfere with microphones 80, microphone cable 101, and WWAN antenna 84.

In response to this problem, a power source shield may be implemented to control the EMF vectors and corresponding electrical and magnetic flux that may interfere with the operation of digitizer 27. More specifically, a power source shield may prevent the digitizer from having improper magnetic field interaction with the digitizer. A copper shield, wrapped about the entire power source may effectively shield the digitizer from the EMF of the power source. However, a tightly wrapped copper shield may produce unwanted side effects. In particular, completely enclosing the power source may inhibit magnetic flux in the power source core material, thereby constraining an amount of AC voltage from being applied to the backlight of the LCD. This voltage loss may require the power source to draw more current, which may in turn result in wasted power and loss of battery life, which may be critical problems with respect to the usability of a portable computer. For at least two reasons, a shield created from completely wrapping the power source in copper may also undesirably increase the magnetic core temperature of the power source, leading to a corresponding thermal problem. First, shielding the entire power source constricts air circulation about the power source, thereby preventing it from dissipating heat through convective means. Second, a complete shield excessively inhibits the magnetic flux emitted by the magnetic core of the power source. The inhibition of magnetic flux causes more current ($I_{CC}$) to flow through the power source, which also causes the core of the power source to generate more heat, thereby exacerbating the decreased ability to dissipate heat associated with the complete shield.

Accordingly, a solution is needed to control the high levels of magnetic flux produced by the power source while not causing the power source to inefficiently consume power and undergo excessive heating. In a typical design, this problem may be solved by mounting the power source behind the digitizer, but this may not be possible in designs with limited space. In compact designs where the power source is mounted outside of the digitizer shield, there is an increased risk that the electromagnetic field generated by the power source will interfere with other components. Unchecked, this interference may cause a multitude of problems with some of the computer's input/output components, such as a jumping cursor via the digitizer, increased microphone noise, and wireless broadband radio interference. A shield composed of an insulating fabric, such as Kapton, can be used to limit the E-field EMF wave emissions and improve WWAN performance, but has no effect on H-field EMF wave emissions. A copper shield composed of a complete copper over wrap, as noted above, can limit the emission of both E-field and H-field EMF waves. However, the complete copper shield effectively short circuits the E-fields and H-fields of the power source, causing it to function inefficiently in terms of power consumption. Another alternative, an insulating fabric shield combined with a copper shield applied to only one side of the power source may still perform inadequately by not limiting H-field EMF emission enough to reduce interference with the digitizer, as indicated by a jumping cursor.

Figure 7A:
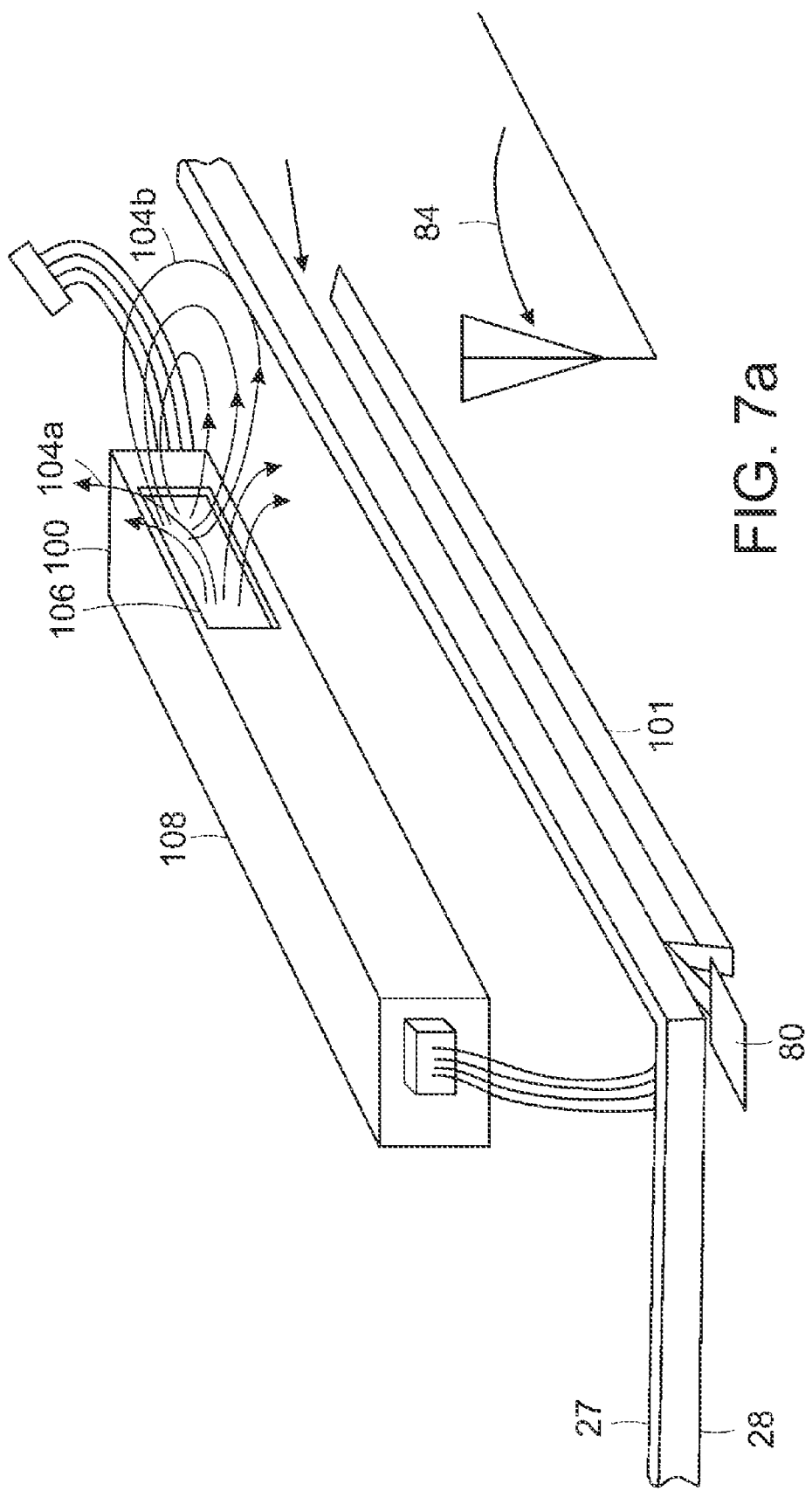
FIG. 7a is a plan view showing a shielded power source assembly mounted in a portable computer.

Ultimately, the problems associated with unwanted H-field magnetic flux may be addressed by creating a modified copper shield, as shown in FIGS. 7*a* and 7*b*. FIG. 7*a* is a plan view showing the power source of FIG. 6*a* with the addition of modified shield 108. FIG. 7*b* is a left side view showing the power source with a shield and nearby components. Modifying the shield to enable optimum functionality may entail creating small aperture 106 in shield 108 on the side of power source 100 that faces handle 24 of the computer, facing away from the sensitive components of the computer. Here, aperture 106 is placed in shield 108 near handle 24 of the device. Aperture 106 may be large enough to allow some E-field radiation 104*a* and H-field radiation 104*b* to escape as well as an avenue for cooling and improved power efficiency, so that a greater percentage of the power consumed by the power source may power the backlight. Aperture 106 is positioned so that the emitted EMF radiation is directed away from sensitive components to minimize the extent to which any noise attributable to the power source will interfere with the components. More particularly, the size and location of aperture 108 may be "tuned" to an ideal location that allows H-field magnetic waves to escape in a direction that will not inhibit performance of microphones 80, microphone cable 101, digitizer 27, and wireless broadband antenna 84, while still allowing enough of E-field radiation 104*a* and H-field radiation 104*b* to escape for power source 100 to operate efficiently and not consume excessive battery power. In one embodiment, it may be ideal to center the aperture over the center of the transformer or field effect transistor (FET) of the power source, as the performance of these elements of the power source may benefit the most from the decreased constraint on EMF emissions. In other embodiments, depending on the wiring configuration and geometry of the transformer and/or FET, it may be desirable to offset the center of the aperture from the center of the transformer or FET to optimally tune the location of the aperture.

The size and location of the aperture may be tuned by observing four different performance characteristics of the power source and surrounding components. First, the size of the aperture has an effect on the efficiency at which the power source operates. Accordingly, the aperture should be large enough to not inhibit current flow through the power source so that the power source will operate efficiently and not waste battery power. Second, the aperture serves as an avenue for heat to escape from the core of the power source, so appropriate sizing of the aperture allows for adequate convective cooling. Third, allowing some H-field radiation to escape reduces the magnetic drag on the power source that results from a completely shielded power source. As noted above, this H-field radiation can interfere with a digitizer by distorting the signals emitted and received by the digitizer so that it can determine the location of the stylus. Here, the aperture should be sized so that it is large enough to reduce the amount of magnetic drag the power source experiences as a result of shielding, while also being located and positioned in a way that will direct any associated magnetic radiation away from the digitizer or other components that may be adversely affected by the H-field radiation. Fourth, the aperture will also allow E-field radiation that can cause noise on nearby circuitry, which means that the aperture should also be located in a position that will cause the least amount of E-field related interference to nearby components. Thus, in a preferred embodiment, the aperture may comprise a single opening in the shield that is positioned so that it will enable adequate cooling and power efficiency, while also limiting the extent to which E-field radiation and H-field radiation will affect sensitive components. In other embodiments, the aperture may comprise a group of smaller openings and still accomplish the desired functionality. Notably, the E-field radiation and H-field radiation can be viewed as comprising E-field and H-field vectors, or lobes, and the use of many smaller openings may allow for more precise direction and control of the EMF than a larger single opening. Although the aperture may have a single size and location, it enables vector control of both the E-fields and H-fields associated with the power source.

FIG. 7b also shows a representation of aperture 106, exposing the unshielded portion of the magnetic core or transformer of power source 100 and shield 108. Further, while a copper shield is discussed, it is noted that any material or combination of materials with similar electromagnetic properties may be substituted. As such, the shield may comprise an insulating layer as well as a metal foil made from a material such as steel, aluminum, copper, mumetal, nickel, nickel alloy, cobalt alloy, some stainless steels, or gold. It is also noteworthy that aperture 106 in copper shield 108 allows heat to escape through convection. Therefore, it may be desirable to implement a thermally conductive path to conduct heat to a part of the computer that can effectively dissipate the heat. Here, a strip of heat spreading material 110, such as Graphtech Spreadershield, can be used to conductively move heat away from power source 100 so that it can be conducted away through the cooling system of the computer or passively dissipated near the handle of the computer. This heat spreading material may be thermally coupled to heat pipes or otherwise coupled with the cooling system of the computer to mitigate any negative thermal consequences associated with shielding power source 100. In short, the power source shield enables direction of both heat and unwanted electromagnetic waves to areas of the computer that will not be adversely affected, thereby minimizing the extent to which the power source interferes or inhibits the performance of the computer.

In sum, a portable computer is disclosed that is optimized and equipped with a robust feature set that makes it ideal for use in medical environments and other challenging work environments. The portable computer is impact resistant, resistant to moisture penetration and contamination from airborne contaminants. The device is also easily cleaned by virtue of its sealed design that makes it resistant to cleaning agents that may be used to remove dirt or kill germs and bacteria. Even though it is partially sealed, the device may incorporate an active cooling system. The device may also incorporate shielding to protect sensitive components from EMF interference and to prevent the emanation of EMF waves into the surrounding environment, thereby decreasing unwanted internal interference, decreasing unwanted electromagnetic radiation, and improving the ability of the portable computer to withstand external electromagnetic interference.

It will be appreciated to those skilled in the art having the benefit of this disclosure that this invention is believed to provide a multi-purpose portable computer with thermal control and a modified power source shield that has improved utility highly mobile and contaminant heavy environments. Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A portable computer, comprising:
   a power source; and
   an electrically conductive foil; wherein
   the electrically conductive foil is configured to at least partially surround at least a portion of the power source; and
   the electrically conductive foil comprises at least one opening formed on one side of the power source, wherein the at least one opening is positioned so as to direct electromagnetic radiation, which is generated by the power source, away from components internal to the portable computer.

2. The portable computer of claim 1, further comprising a thermally conductive material, operable to conductively transfer heat away from the at least one opening formed on the one side of the power source.

3. The portable computer of claim 1, wherein the at least one opening is configured to permit an electromagnetic field associated with the power source of a pre-selected magnitude.

4. The portable computer of claim 1, wherein the at least one opening is approximately rectangular.

5. The portable computer of claim 1, wherein the at least one opening comprises a group of smaller openings.

6. The portable computer of claim 1, wherein the electrically conductive foil is selected from a group consisting of copper, steel, gold, and aluminum foils.

7. The portable computer of claim 1, wherein the power source is installed near an edge of the portable computer, and wherein the at least one opening is formed on the one side of the power source facing the edge of the portable computer.

8. The portable computer of claim 3, wherein a size and location of the at least one opening determines the pre-selected magnitude of the electromagnetic field associated with the power source.

9. A method for fabricating an electromagnetic shield in an electronic device, comprising:
   enclosing at least a portion of a power source in a conductive material;
   forming at least one opening in the conductive material on one side of the power source;
   installing the power source near an edge of the electronic device; and
   orienting the power source so that the at least one opening faces the edge of the electronic device.

10. The method of claim 9, wherein the conductive material is selected from the group consisting of copper, steel, gold, and aluminum foils.

11. The method of claim 9, wherein the at least one opening comprises a group of smaller openings.

12. The method of claim 9, wherein said forming the at least one opening comprises orienting the at least one opening so as to direct electromagnetic radiation away from any sensitive circuitry of the electronic device.

13. The method of claim 9, wherein said forming the at least one opening comprises selecting a size and location of the at least one opening so that the power source will operate at a pre-selected efficiency.

* * * * *

UNITED STATES PATENT AND TRADEMARK OFFICE
CERTIFICATE OF CORRECTION

Page 1 of 1

PATENT NO. : 7,969,730 B1
APPLICATION NO. : 12/634340
DATED : June 28, 2011
INVENTOR(S) : Doherty et al.

It is certified that error appears in the above-identified patent and that said Letters Patent is hereby corrected as shown below:

ON THE COVER PAGE:

(73) Assignee: Please delete "Motion Computer, Inc." and replace with --Motion Computing, Inc.--

Signed and Sealed this
Fifteenth Day of January, 2013

David J. Kappos
*Director of the United States Patent and Trademark Office*